(12) United States Patent
Kang et al.

(10) Patent No.: US 7,867,846 B2
(45) Date of Patent: Jan. 11, 2011

(54) ORGANIC LIGHT EMITTING DISPLAY (OLED) HAVING A GAS VENT GROOVE TO DECREASE EDGE OPEN FAILURES

(75) Inventors: Tae-Min Kang, Yongin (KR); Seong-Taek Lee, Yongin (KR); Myung-Won Song, Yongin (KR); Mu-Hyun Kim, Yongin (KR); Byung-Doo Chin, Yongin (KR); Jae-Ho Lee, Yongin (KR)

(73) Assignee: Samsung Mobile Display Co., Ltd., Giheung-Gu, Yongin, Gyunggi-Do (KR)

( * ) Notice: Subject to any disclaimer, the term of this patent is extended or adjusted under 35 U.S.C. 154(b) by 0 days.

(21) Appl. No.: 12/835,082

(22) Filed: Jul. 13, 2010

(65) Prior Publication Data

US 2010/0276680 A1 Nov. 4, 2010

Related U.S. Application Data

(62) Division of application No. 11/318,437, filed on Dec. 28, 2005.

(30) Foreign Application Priority Data

Jan. 4, 2005 (KR) ............... 10-2005-0000581

(51) Int. Cl.
*H01L 21/336* (2006.01)
*H01L 51/50* (2006.01)
*H01L 27/32* (2006.01)

(52) U.S. Cl. ............. 438/259; 438/29; 438/42; 438/43; 438/44; 438/270; 438/700; 438/701; 438/702

(58) Field of Classification Search ............ 438/29, 438/42, 43, 44, 259, 270, 700, 701, 702
See application file for complete search history.

(56) References Cited

U.S. PATENT DOCUMENTS

| 7,129,636 B2 | 10/2006 | Chang |
| 2003/0193057 A1 | 10/2003 | Humbs et al. |
| 2007/0063636 A1 | 3/2007 | Guenther et al. |

FOREIGN PATENT DOCUMENTS

| CN | 1462477 | 12/2003 |
| JP | 11-065487 | 3/1999 |

(Continued)

OTHER PUBLICATIONS

Japanese Patent Office Action issued on May 12, 2009 in the corresponding Japanese Patent Application No. 2006-000220.

(Continued)

*Primary Examiner*—Thanh V Pham
(74) *Attorney, Agent, or Firm*—Robert E. Bushnell, Esq.

(57) ABSTRACT

An Organic Light Emitting Display (OLED) and its fabrication method has a pixel defining layer provided on a first electrode which is formed with a gas vent groove to allow gas to vent when the pixel defining layer is being formed, so that gas is not left in a pixel but vented when a donor film is laminated by a Laser-Induced Thermal Imaging (LITI) method, thereby decreasing edge open failures.

11 Claims, 4 Drawing Sheets

FOREIGN PATENT DOCUMENTS

| | | |
|---|---|---|
| JP | 2002-352951 | 12/2002 |
| JP | 2003-168569 | 6/2003 |
| JP | 2003-332069 | 11/2003 |
| JP | 2004-356108 | 12/2004 |
| WO | 2004/086529 | 10/2004 |

OTHER PUBLICATIONS

Chinese Patent Registration Gazette issued on Sep. 30, 2009 in the corresponding Chinese Patent Application No. 200510137564.0.

ORGANIC LIGHT EMITTING DISPLAY (OLED) HAVING A GAS VENT GROOVE TO DECREASE EDGE OPEN FAILURES

CROSS-REFERENCE TO RELATED APPLICATIONS AND CLAIM OF PRIORITY

This application is a divisional of Applicants' Ser. No. 11/318,437 entitled ORGANIC LIGHT EMITTING DISPLAY (OLED) HAVING A GAS VENT GROOVE TO DECREASE EDGE OPEN FAILURES filed in the U.S. Patent & Trademark Office on the 28 Dec. 2005 has been allowed, and assigned to the assignee of the above-captioned application. Furthermore, this application makes reference to, incorporates the same herein, and claims all benefits accruing under 35 U.S.C. §119, §120 and §121 from the aforesaid Applicant's Ser. No. 11/318,437 and from an application for ORGANIC ELECTRO LUMINESCENCE DISPLAY AND METHOD FOR MANUFACTURING THE SAME earlier filed in the Korean Intellectual Property Office on 4 Jan. 2005 and there duly assigned Serial No. 10-2005-0000581.

BACKGROUND OF THE INVENTION

1. Field of the Invention

The present invention relates to an Organic Light Emitting Display (OLED), and more particularly, to an OLED and its fabrication method, in which a pixel defining layer provided on a first electrode is formed with a gas vent groove, so that a pixel edge region to which transfer is finally applied is prevented from having an untransferred portion due to gas internally remaining in a pixel and condensed when a donor film is laminated by a Laser-Induced Thermal Imaging (LITI) method, thereby decreasing edge open failures.

2. Description of the Related Art

A full-color organic light emitting diode includes a first electrode patterned on a substrate. For a bottom emission organic light emitting diode, the first electrode is a transparent electrode. For a top emission organic light emitting diode, the first electrode is of a transparent conductive material and includes a reflective layer.

A Pixel Defining Layer (PDL) is formed of an insulating material on the first electrode, thereby defining a pixel region and insulating emission layers from each other.

In the pixel region defined by the PDL, an organic layer including organic emission layers (R, G and B) is formed. Furthermore, the organic layer can further include a hole injection layer, a hole transporting layer, a hole blocking layer, an electron transporting layer, an electron injection layer, etc. The organic emission layer can be formed either of a polymer or a small molecule material.

A second electrode is formed on the organic layer. When the first electrode is a transparent electrode, the second electrode is of a conductive metal layer used as a reflective electrode. On the other hand, when the first electrode is a transparent conductive electrode including a reflective layer, the second electrode is a transparent electrode. Then, the OLED is encapsulated and completed.

In a donor film structure for a Laser-Induced Thermal Imaging (LITI) method, when the emission layer is formed by the LITI method, the donor film for the LITI method includes a base film, a light-to-heat conversion layer, and a transfer layer.

The light-to-heat conversion layer expands when laser energy is applied, so that the transfer layer also expands and is therefore separated from the donor film, thereby being transferred to a substrate of the OLED.

However, in the OLED, a remaining gas A is condensed in a pixel edge region when the donor film is laminated, so that a portion B in which a transfer has not been performed occurs. Such a failure is called 'an edge open failure' or 'an untransferred failure', which reduces the life span and performance of the display.

SUMMARY OF THE INVENTION

The present invention, therefore, provides an Organic Light Emitting Display (OLED) and its fabrication method, in which a pixel defining layer provided on a first electrode includes to a gas vent groove, so that gases remaining and condensed in the pixel are vented when an emission layer is formed by a LITI method, thereby completely transferring a donor film to a final transfer region, and preventing an untransferred failure.

In one exemplary embodiment of the present invention, an Organic Light Emitting Display (OLED) includes: a first electrode arranged on a substrate; a pixel defining layer having at least one gas vent groove, the pixel defining layer being arranged on the first electrode; an organic layer divided by the pixel defining layer and including at least an emission layer arranged on an exposed first electrode region; and a second electrode arranged on the organic layer.

The first electrode preferably includes a transparent electrode including one material selected from a group consisting of Indium Tin Oxide (ITO), Indium Zinc Oxide (IZO) and $In_2O_3$.

The pixel defining layer preferably includes either an organic or inorganic insulating layer.

The gas vent groove of the pixel defining layer is preferably arranged in a pixel edge region. The gas vent groove arranged in the pixel edge region preferably has a depth of 1 μm through a cross-sectional thickness of the pixel defining layer. The gas vent groove arranged in the pixel edge region is preferably connected to adjacent pixels. The gas vent groove preferably has a width within 30% of at least one of an entire horizontal or vertical length of the pixel region.

The OLED preferably further includes a thin film transistor arranged on the substrate.

The second electrode preferably includes either a transparent or semi-transparent electrode including one material selected from a group consisting of Ca, Mg, MgAg, Ag, an Ag alloy, Al and an Al alloy.

In another exemplary embodiment of the present invention, method of fabricating an Organic Light Emitting Display (OLED) includes: forming a first electrode on a substrate; forming an insulating layer on the first electrode; forming a pixel defining layer having at least one gas vent groove by patterning the insulating layer; forming an organic layer on the pixel defining layer, the organic layer being divided by the pixel defining layer and including at least an emission layer, by applying a Laser-Induced Thermal Imaging (LITI) method to the exposed first electrode and the pixel defining layer; and forming a second electrode on the organic layer.

The first electrode is preferably formed of a transparent electrode including one material selected from a group consisting of Indium Tin Oxide (ITO), indium Zinc Oxide (IZO) and $In_2O_3$.

The gas vent groove is preferably formed by either a wet or dry etching method.

The pixel defining layer is preferably formed of either an organic or inorganic insulating layer.

The gas vent groove of the pixel defining layer is preferably arranged in a pixel edge region. The gas vent groove arranged in the pixel edge region preferably has a depth of 1 μm through a cross-sectional thickness of the pixel defining layer. The gas vent groove arranged in the pixel edge region is preferably connected to adjacent pixels. The gas vent groove preferably has a width within 30% of one of an entire horizontal or vertical length of the pixel region.

The method preferably further includes a thin film transistor arranged on the substrate.

The second electrode is preferably formed of a transparent or semi-transparent electrode including one material selected from a group consisting of Ca, Mg, MgAg, Ag, an Ag alloy, Al and an Al alloy.

BRIEF DESCRIPTION OF THE DRAWINGS

A more complete appreciation of the present invention, and many of the attendant advantages thereof, will be readily apparent as the present invention becomes better understood by reference to the following detailed description when considered in conjunction with the accompanying drawings in which like reference symbols indicate the same or similar components, wherein.

DETAILED DESCRIPTION OF THE INVENTION

Figure 1:
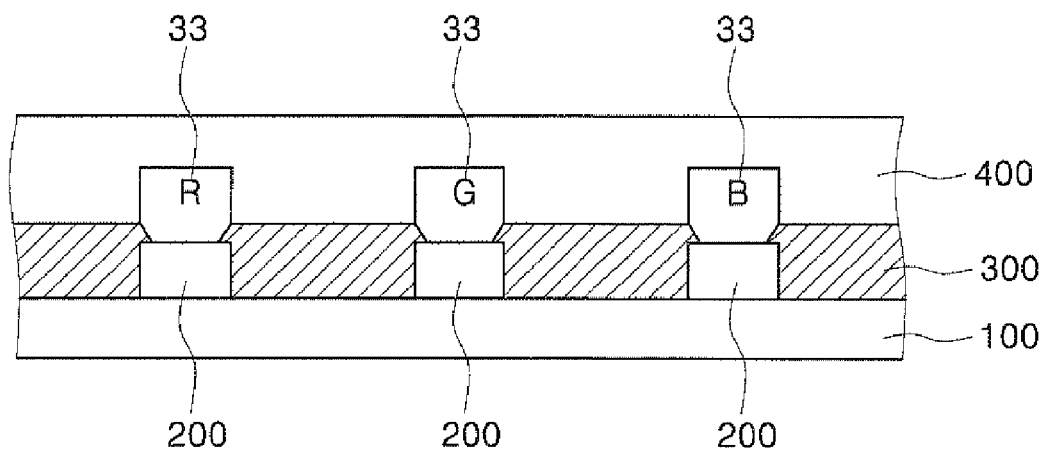
FIG. 1 is a cross-sectional view of a full-color organic light emitting diode.

FIG. 1 is a cross-sectional view of a full-color organic light emitting diode.

Referring to FIG. 1, a first electrode 200 is patterned on a substrate 100. For a bottom emission organic light emitting diode, the first electrode 200 is a transparent electrode. For a top emission organic light emitting diode, the first electrode is of a transparent conductive material and includes a reflective layer.

A Pixel Defining Layer (PDL) 300 is formed of an insulating material on the first electrode 200, thereby defining a pixel region and insulating emission layers from each other.

In the pixel region defined by the PDL 300, an organic layer including organic emission layers (R, G and B) 33 is formed. Furthermore, the organic layer 33 can further include a hole injection layer, a hole transporting layer, a hole blocking layer, an electron transporting layer, an electron injection layer, etc. The organic emission layer can be formed either of a polymer or a small molecule material.

A second electrode 400 is formed on the organic layer 33. When the first electrode 200 is a transparent electrode, the second electrode 400 is of a conductive metal layer used as a reflective electrode. On the other hand, when the first electrode 200 is a transparent conductive electrode including a reflective layer, the second electrode 400 is a transparent electrode. Then, the Organic Light Emitting Display (OLED) is encapsulated and completed.

Figure 2:
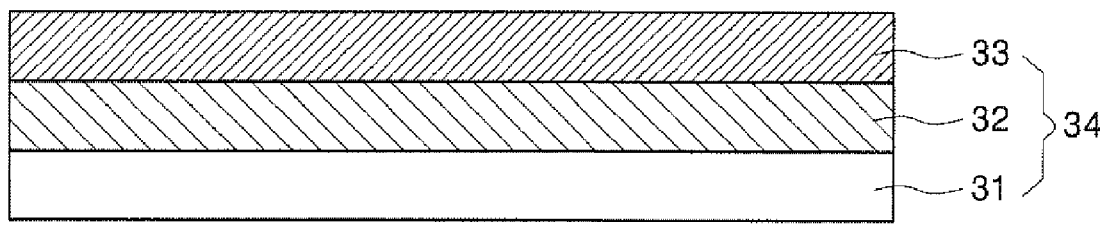
FIG. 2 is a cross-sectional view of a donor film structure for a Laser-Induced Thermal Imaging (LITI) method.

FIG. 2 is a cross-sectional view of a donor film structure for a Laser-Induced Thermal Imaging (LITI) method.

As shown in FIG. 2, when the emission layer is formed by the LITI method, the donor film 34 for the LITI method includes a base film 31, a light-to-heat conversion layer 32, and a transfer layer 33.

Figure 3:
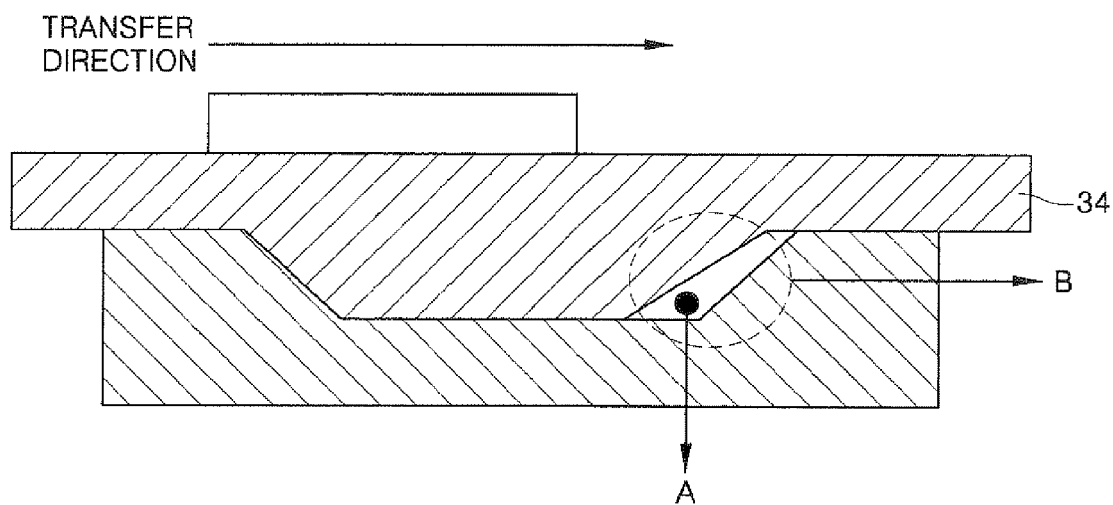
FIG. 3 is a transfer model using a donor film.

FIG. 3 is a view of a transfer model using a donor film. As shown in FIG. 3, the light-to-heat conversion layer expands when laser energy is applied, so that the transfer layer also expands and is therefore separated from the donor film, thereby being transferred to a substrate of the OLED.

However, in the OLED, a remaining gas A is condensed in a pixel edge region when the donor film is laminated, so that a portion B in which a transfer has not been performed occurs. Such a failure is called 'an edge open failure' or 'an untransferred failure', which reduces the life span and performance of the display.

The present invention is described more fully hereinafter with reference to the accompanying drawings, in which exemplary embodiments of the present invention are shown. The present invention can, however, be embodied in different forms and should not be construed as being limited to the embodiments set forth herein.

Figure 4:
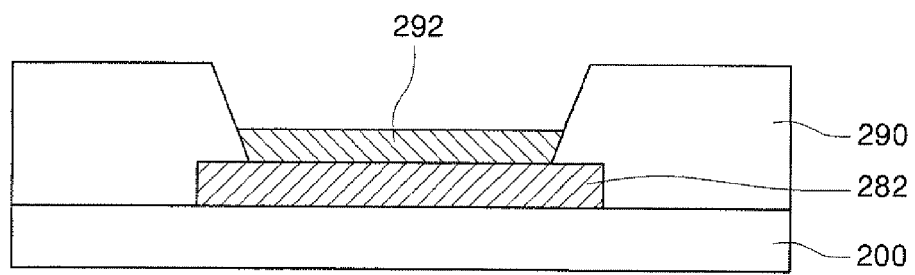
FIG. 4 is a cross-sectional view of an Organic Light Emitting Display (OLED) according to an embodiment of the present invention.

FIG. 4 is a cross-sectional view of an OLED according to an embodiment of the present invention.

Referring to FIG. 4, a first electrode 282 is formed on the entire surface of a substrate 200 consisting of glass, quartz, plastic or metal. The first electrode 282 is used as an anode electrode. For a top emission structure, the first electrode 282 has a double and/or triple laminated structure including a reflective layer, and an upper pixel electrode or upper/lower pixel electrodes formed as a transparent electrode including one material selected from a group consisting of ITO, IZO and $In_2O_3$. For a bottom emission structure, the first electrode 282 is a transparent electrode.

Then, an insulating layer (not shown) is formed on the entire surface of the resultant structure. The insulating layer can be formed of an organic or inorganic material. When the insulating layer is formed of an organic material, the organic material can include one material selected from a group consisting of benzocyclobutene (BCB), acrylic photoresist, phenol photoresist and polyimide photoresist, but is not limited thereto.

Then, the insulating layer is etched to form a pixel defining layer 290 having at least one gas vent groove (not shown). The pixel defining layer 290 having at least one gas vent groove can be formed by etching the insulating layer using a wet etching method or a dry etching method. In the wet etching method, acid diluted with water and having a temperature of 200° C. or less is used as an etchant for etching the insulating layer, thereby forming the pixel defining layer having at least one gas vent groove. Furthermore, in the wet etching method, a neutralizing process and a cleaning process are necessary for neutralizing the acid. In the dry etching method, a photoresist pattern formed on the insulating layer by a photolithography process is used to form the pixel defining layer having at least one gas vent groove. To perform the dry etching method, a reaction gas is generally used. After the dry etching method is performed, a process of removing the photoresist using a high concentration alkali solution and a cleaning process using plasma treatment must be performed.

The pixel region having at least one gas vent groove formed by the foregoing etching process is formed as follows.

Figure 5:
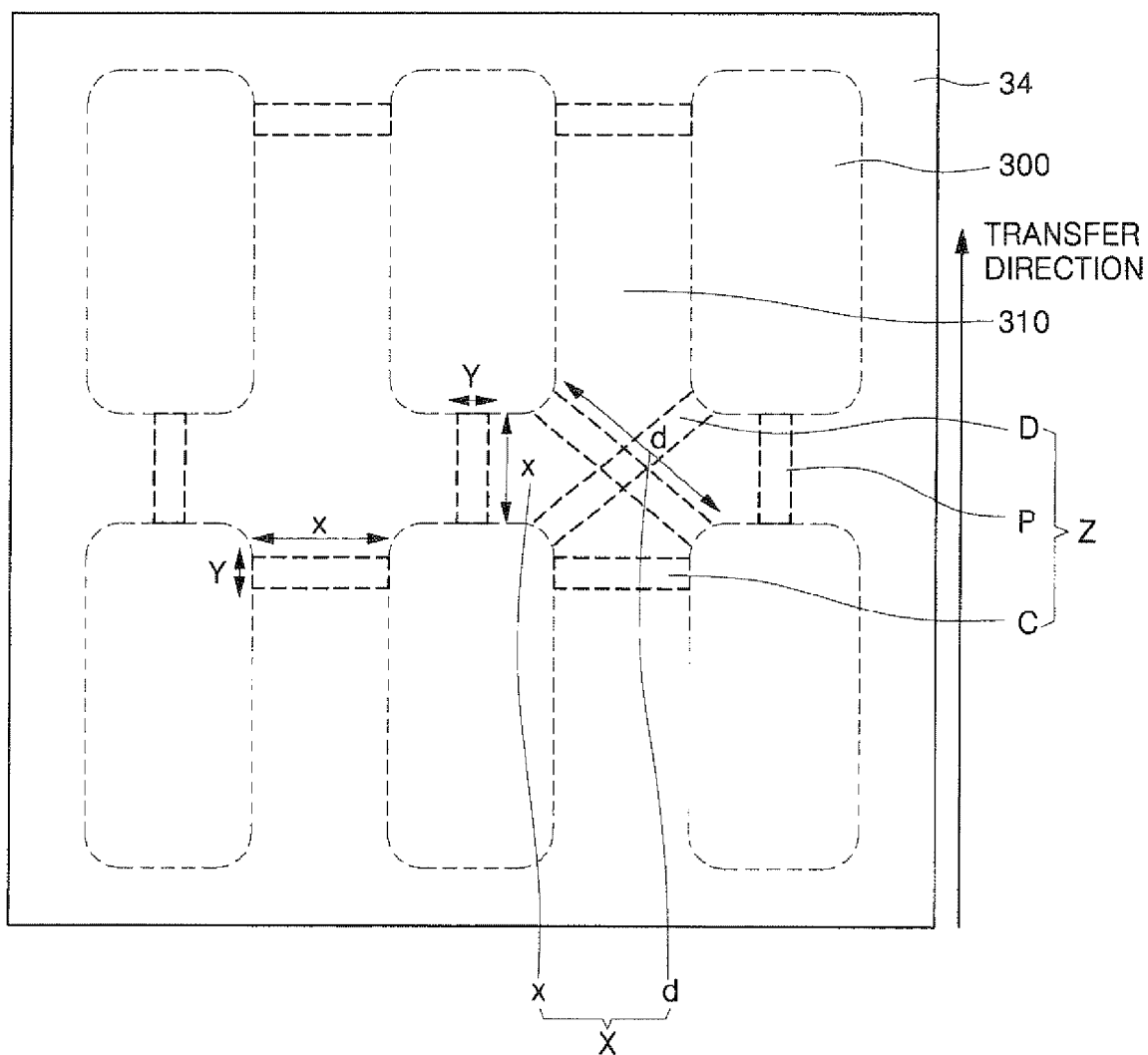
FIG. 5 is a plan view of a pixel region having a gas vent groove according to an embodiment of the present invention.

FIG. 5 is a plan view of a pixel region having a gas vent groove according to an embodiment of the present invention.

Referring to FIG. 5, when a donor film 34 including at least a base film, a light-to-heat conversion layer and a transfer layer is disposed on the entire surface of the pixel region, the gas vent groove Z is generally formed within the pixel defining layer 310 of a pixel edge portion in consideration of a LITI applying direction. Preferably, one or more gas vent grooves Z are formed within the pixel defining layer 310 of a pixel edge portion opposite to the pixel edge portion in which the LITI process is started, in a cross direction C, a parallel direction P and a diagonal direction D, thereby preventing gas from being condensed in the pixel edge portion. For example, the gas vent groove can be formed in a direction parallel to the transfer direction, a direction vertical to the transfer direction, or a direction diagonal to the transfer direction. When the gas vent groove is formed in the direction vertical to the transfer direction, the gas vent groove is preferably formed in the center of the pixel defining layer. The gas vent groove has a depth (not shown) of 1 μm through the cross-sectional thickness of the pixel defining layer. Furthermore, the gas vent groove has a length X corresponding to a distance x between left and right pixel defining layers or up and down pixel defining layers to divide the adjacent pixels, or a length X corresponding to a diagonal distance d between the pixels. In other words, the gas vent grooves are formed to be connected to the adjacent pixels in any one of the parallel, vertical and diagonal directions. Furthermore, the gas vent groove has a width Y within 30% of the entire horizontal and/or vertical length of the pixel region.

Then, an organic layer is formed in an emission region exposed by the pixel defining layer 310. The organic layer includes at least the light-to-heat conversion layer and the transfer layer. The organic layer is formed by the LITI method that forms an emission layer by laminating the multi-layer donor film.

Figure 6:
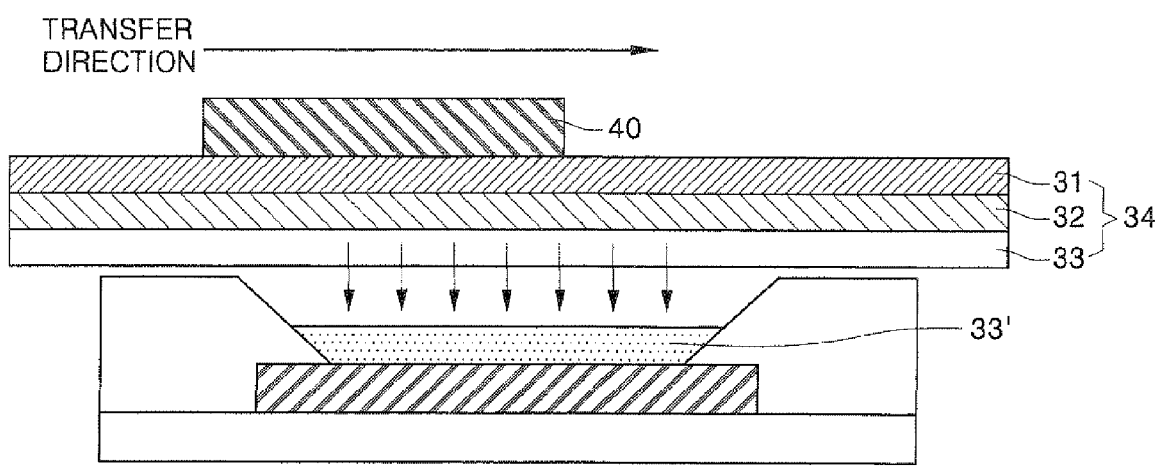
FIG. 6 is a cross-sectional view of an organic layer formed using the LITI method.

FIG. 6 is a cross-sectional view of an organic layer formed using the LITI method.

Referring to FIG. 6, the base film 31 of the donor film having the foregoing structure and used in the LITI method consists of a transparent material because it is transferred to the light-to-heat conversion layer 32 when a laser 40 is applied to the base film 31. For example, the base film 31 consists of one or more polymers selected from a group consisting of polyethylene terephthalate, polyester, polyacryl, polyepoxy, polyethylene and polystyrene, or a glass substrate. Preferably, the base film 31 consists of polyethylene terephthalate.

Furthermore, the light-to-heat conversion layer 32 provided on the base film 31 is employed for absorbing infrared-visible light and transforming some of the absorbed light into heat. The light-to-heat conversion layer 32 should have proper optical density and include a light-absorbing material to absorb the light. The light-to-heat conversion layer 32 can be formed either of a metal layer including Al, Ag or oxides and sulfides thereof, or an organic layer including carbon black, graphite or a polymer containing an infrared dye. The metal layer can be formed by a vapor deposition method, an electron beam deposition method, or a sputtering method. Also, the organic layer can be formed by a general film coating method such as roll coating, gravure, extrusion, spin coating, knife coating, or the like.

Then, the transfer layer 33 provided on the light-to-heat conversion layer 32 can either include a small molecule organic material or a polymer organic material.

An interlayer can be selectively added between the light-to-heat conversion layer 32 and the transfer layer 33 so as to enhance the transfer characteristics. The interlayer can be a gas generating layer (not shown), a buffer layer (not shown) or a metal reflective layer (not shown).

The gas generating layer causes a decomposition reaction when it absorbs light or heat, thereby generating nitrogen or hydrogen gas and providing transferring energy. The gas generating layer can include pentaerythrite tetranitrate, trinitrotoluene, or etc.

Furthermore, the buffer layer is employed for preventing the light-heat absorbable material from contaminating or damaging the transfer layer formed in the subsequent process, and controlling adhesion between the light-heat absorbable material and the transfer layer to enhance transferring pattern characteristics. The buffer layer can include a metal oxide, a non-metal inorganic compound or an inert polymer.

Also, the metal reflective layer is employed for not only reflecting the laser energy irradiated to the base film 31 of the donor film 34 to transfer much more energy to the light-to-heat conversion layer 32 but also preventing the gas generated by the gas generating layer from permeating the transfer layer 33 when a gas generating layer is added.

The organic layer 33' fin wed using the donor film 23 with this configuration includes at least an organic emission layer. Additionally, the organic layer 33' can include an electron injection layer, an electron transporting layer, a hole injection layer, a hole transporting layer, a hole blocking layer, etc.

Then, a second electrode (not shown) is formed on the organic layer, thereby completing the OLED. The second electrode is used as a cathode electrode. For the top emission structure, the second electrode is a transparent electrode. For the bottom emission structure, the second electrode is a reflective electrode or an electrode including a reflective layer. The electrode including the reflective layer consists of a transparent or semi-transparent electrode including one material selected from a group consisting of Ca, Mg, MgAg, Ag, an Ag alloy, Al and an Al alloy.

Thus, when the pixel defining layer having at least one gas vent groove is formed on the first electrode, the gas remaining in the pixel is vented to the surrounding thereof when the emission layer is being formed by the LITI method, so that the transfer layer of the donor film is perfectly transferred to the final transferring pixel region, thereby decreasing edge open failures.

Furthermore, in the OLED that includes: a first electrode formed on the substrate; a pixel defining layer having at least one gas vent groove on the first electrode; an organic layer divided by the pixel defining layer and including at least an emission layer on the exposed first electrode region; and a second electrode formed on the organic layer, the OLED can further include a thin film transistor. The thin film transistor includes a semiconductor layer having source and drain regions between the substrate and the first electrode, source and drain electrodes connected to the source and drain regions, and a gate electrode corresponding to the channel region.

The thin film transistor can have a top gate structure in which the semiconductor layer is formed on the substrate and the gate electrode is formed on the semiconductor layer, or a bottom gate structure in which the gate electrode is formed on the substrate and the semiconductor layer is formed on the gate electrode.

Furthermore, the semiconductor layer can be formed of an amorphous silicon layer or a polysilicon layer formed by crystallizing an amorphous silicon layer using Excimer Laser Annealing (ELA), Sequential Lateral Solidification (SLS), Metal Induced Crystallization (MIC), Metal Induced Lateral Crystallization (MILC) or Super Grain Silicon (SGS).

The foregoing thin film transistor can be used in the OLED in which one of the source and drain electrodes provided between the substrate and the first electrode and exposed through a via hole is connected to the first electrode.

As described above, the present invention provides an OLED and its fabrication method, in which the pixel defining layer having at least one gas vent groove is formed on the first electrode, so that the gas remaining between the first electrode and the donor film when the emission layer is being formed using the LITI method is not condensed in the transferring direction when the donor film is laminated, thereby decreasing edge open failures due to an untransferred portion of the donor film in the pixel edge region.

Although the present invention has been described with reference to certain exemplary embodiments thereof, it will be understood by those skilled in the art that a variety of modifications and variations can be made to the present invention without departing from the spirit or scope of the present invention as defined by the appended claims.

What is claimed is:

1. A method of fabricating an Organic Light Emitting Display (OLED), the method comprising:
   forming a first electrode on a substrate;
   forming an insulating layer on the first electrode;
   forming a pixel defining layer having at least one gas vent groove by patterning the insulating layer;
   forming an organic layer on the pixel defining layer, the organic layer being divided by the pixel defining layer and including at least an emission layer, by applying a Laser-Induced Thermal Imaging (LITI) method to the exposed first electrode and the pixel defining layer; and
   forming a second electrode on the organic layer.

2. The method according to claim 1, wherein the first electrode is formed of a transparent electrode including one material selected from a group consisting of Indium Tin Oxide (ITO), Indium Zinc Oxide (IZO) and $In_2O_3$.

3. The method according to claim 1, wherein the gas vent groove is formed by either a wet or dry etching method.

4. The method according to claim 1, wherein the pixel defining layer is formed of either an organic or inorganic insulating layer.

5. The method according to claim 1, wherein the gas vent groove of the pixel defining layer is arranged in a pixel edge region.

6. The method according to claim 5, wherein the gas vent groove arranged in the pixel edge region has a depth of 1 µm through a cross-sectional thickness of the pixel defining layer.

7. The method according to claim 5, wherein the gas vent groove arranged in the pixel edge region is connected to adjacent pixels.

8. The method according to claim 5, wherein the gas vent groove has a width within 30% of one of an entire horizontal or vertical length of the pixel region.

9. The method according to claim 1, further comprising a thin film transistor arranged on the substrate.

10. The method according to claim 1, wherein the second electrode is formed of a transparent or semi-transparent electrode including one material selected from a group consisting of Ca, Mg, MgAg, Ag, an Ag alloy, Al and an Al alloy.

11. An Organic Light Emitting Display (OLED) fabricated according to the method of claim 2, comprised of:
    the pixel defining layer is arranged on the first electrode;
    the gas vent groove of the pixel defining layer is arranged in a pixel edge region and being connected to at least one neighboring pixel;
    the emission layer is arranged on an exposed first electrode region; and
    the second electrode is formed of a transparent or semi-transparent electrode including one material selected from a group consisting of Ca, Mg, MgAg, Ag, an Ag alloy, Al and an Al alloy.

* * * * *